United States Patent
Zhan et al.

(10) Patent No.: US 12,424,436 B2
(45) Date of Patent: Sep. 23, 2025

(54) PROCESS METHOD FOR IMPROVING RELIABILITY OF METAL GATE HIGH-VOLTAGE DEVICE

(71) Applicant: Shanghai Huali Integrated Circuit Corporation, Shanghai (CN)

(72) Inventors: Yaoyu Zhan, Shanghai (CN); Qiwei Wang, Shanghai (CN); Zhigang Zhang, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 488 days.

(21) Appl. No.: 18/173,981

(22) Filed: Feb. 24, 2023

(65) Prior Publication Data

US 2023/0274931 A1    Aug. 31, 2023

(30) Foreign Application Priority Data

Feb. 28, 2022   (CN) .......................... 202210185315.2

(51) Int. Cl.
  *H01L 21/02*   (2006.01)
  *H01L 21/311*  (2006.01)

(52) U.S. Cl.
  CPC .. *H01L 21/02167* (2013.01); *H01L 21/02271* (2013.01); *H01L 21/31111* (2013.01); *H01L 21/31116* (2013.01)

(58) Field of Classification Search
  CPC ......... H01L 21/02167; H01L 21/02271; H01L 21/31111; H01L 21/3111
  See application file for complete search history.

(56) References Cited

U.S. PATENT DOCUMENTS

| | | | |
|---|---|---|---|
| 2007/0281495 A1* | 12/2007 | Mallick | C23C 16/452 257/E21.252 |
| 2019/0096769 A1* | 3/2019 | Ching | H10D 84/0151 |
| 2022/0277964 A1* | 9/2022 | Krishnan | C09G 1/02 |

OTHER PUBLICATIONS ip.com Search history, (Year: 2025).*

* cited by examiner

*Primary Examiner* — Zandra V Smith
*Assistant Examiner* — Andre C Stevenson
(74) *Attorney, Agent, or Firm* — Banner & Witcoff, Ltd.

(57) ABSTRACT

The present application provides a process method for improving reliability of a metal gate high-voltage device. Stacks layers formed over the gate oxide layer and spaced apart from each other. An SiCN layer is deposited to cover tops and sidewalls of the stack layers, and cover bottoms of slots between the stack layers. An HARP layer is deposited to covert the SiCN layer. The HARP layer over the stack layers and the slot regions is covered with a photoresist. Photolithography and etching are sequentially performed to open the HARP layer over the stack layers. The photoresist in the slot regions is reserved. The HARP layer over the stack layers outside the slot regions is removed. The operations are repeated for many times until the slot regions are filled with the HARP layer.

10 Claims, 4 Drawing Sheets

PROCESS METHOD FOR IMPROVING RELIABILITY OF METAL GATE HIGH-VOLTAGE DEVICE

CROSS-REFERENCE TO RELATED APPLICATIONS

This application claims priority to Chinese patent application No. 202210185315.2, filed on Feb. 28, 2022, the disclosure of which is incorporated herein by reference in its entirety.

TECHNICAL FIELD

The present application relates to the technical field of semiconductors, in particular to a process method for improving reliability of a metal gate high-voltage device.

BACKGROUND

When the technology node is below 28 nm, the logic device becomes very small, and the quantum effect and the like become more prominent. The original traditional polysilicon gate and silicon oxide dielectric layer can no longer meet the requirements of high-performance devices, so high-K materials and metal gates are introduced. In the traditional polysilicon gate process, polysilicon is directly connected from the contact as the gate, while in the metal gate process, after the metal gate is filled, there will be a Chemical-Mechanical Polishing (CMP) process to remove the excess metal. In the CMP process, the middle part of the large metal gate will be polished quickly, and the edge part will be polished slowly, so it is very easy to form a depression, which has a serious impact on the quality of the metal gate. Especially in HV devices, the channel area is large, and the area of the metal gate is also correspondingly large. It is very important to solve the problem of metal gate dish effect.

At present, the method to solve the metal gate dish effect is to add slots in the polysilicon to divide the large metal gate into many small pieces. The gate oxide at the slots has the risk of exposure. In the subsequent process, various plasmas/charges/metal ions will affect the gate oxide, which poses a serious challenge to the reliability of devices. Therefore, a method for filling and protecting polysilicon slot regions needs to be developed.

BRIEF SUMMARY

In view of the disadvantages of the existing technology, the purpose of the present application is to provide a process method for improving reliability of a metal gate high-voltage device, which is used to solve the problem that the gate oxide layer is caused to be damaged by plasma or charge penetration in the subsequent process since the slot regions in the formation process of the high-voltage device in the existing technology are only protected by an extremely thin gate oxide layer.

In order to achieve the above and other related purposes, the present application provides a process method for improving reliability of a metal gate high-voltage device, which at least includes:
step 1: providing a semiconductor structure, the semiconductor structure including a high-voltage device active area; a gate oxide layer formed over the high-voltage device active area; and stack layers formed over the gate oxide layer and spaced apart from each other, regions between the stack layers being slot regions;
step 2: depositing an SiCN layer to cover tops and sidewalls of the stack layers, and cover bottoms of slots between the stack layers;
step 3: depositing a high aspect ratio process (HARP) layer to cover the SiCN layer;
step 4: covering the HARP layer over the stack layers and the slot regions with a photoresist, sequentially performing photolithography and etching to open the HARP layer over the stack layers, and reserving the photoresist in the slot regions;
step 5: removing the HARP layer over the stack layers outside the slot regions;
step 6: repeating steps 3 to step 5 for many times until the slot regions are filled with the HARP layer; and
step 7: performing etching to remove the SiCN layer over the stack layers.

Exemplarily, in step 1, the stack layers are formed by sequentially stacking at least polysilicon, silicon nitride and a plasma enhanced oxide (PEOX) layer from bottom to top.

Exemplarily, in step 2, the thickness of the SiCN layer is 90 Å.

Exemplarily, in step 2, a method for depositing the SiCN layer is chemical vapor deposition.

Exemplarily, in step 3, the thickness of the deposited HARP layer is 150 Å.

Exemplarily, in step 5, a wet etching process is adopted to remove the HARP layer over the stack layers outside the slot regions.

Exemplarily, in step 5, etching solution in the wet etching process is hydrofluoric acid.

Exemplarily, in step 5, the concentration of hydrofluoric acid is 300:1 or 200:1.

Exemplarily, in step 6, step 3 to step 5 are repeated for 1-2 times.

Exemplarily, in step 7, a method for performing etching to remove the SiCN layer is dry etching.

As described above, the process method for improving the reliability of the metal gate high-voltage device provided by the present application has the following beneficial effects: by adding the HARP layer in the slot regions and repeating the deposition and etching processes of the HARP layer, an HARP protective layer is formed inside the slot regions and no HARP is remained in other regions, thus improving the reliability of the high-voltage device without affecting other devices.

DETAILED DESCRIPTION OF THE APPLICATION

The implementation modes of the present application will be described below through specific examples. Those skilled in the art can easily understand other advantages and effects of the present application from the content disclosed in the description. The present application can also be implemented or applied in different specific implementation modes. Various details in the description can also be modified or changed based on different views and applications without departing from the spirit of the present application.

Refer to FIG. 1 to FIG. 7. It should be noted that the drawings provided in the embodiment only illustrate the basic concept of the present application in a schematic way, only illustrate the components related to the present application, and are not drawn according to the number, shape and size of the components in actual implementation. The type, number and scale of the components in actual implementation may be changed freely, and the layout of the components may be more complex.

Figure 1:
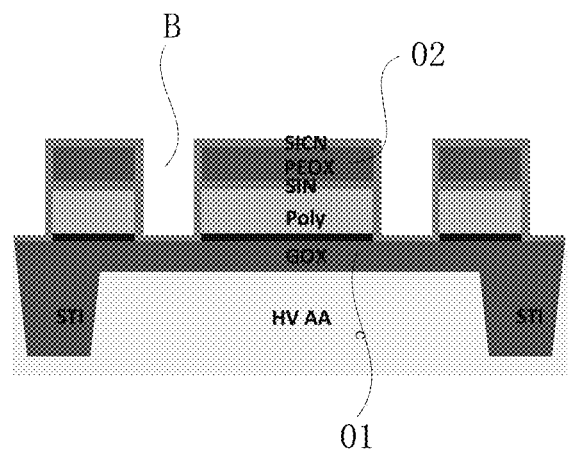
FIG. 1 illustrates a schematic diagram of a semiconductor structure in the present application.
Figure 7:
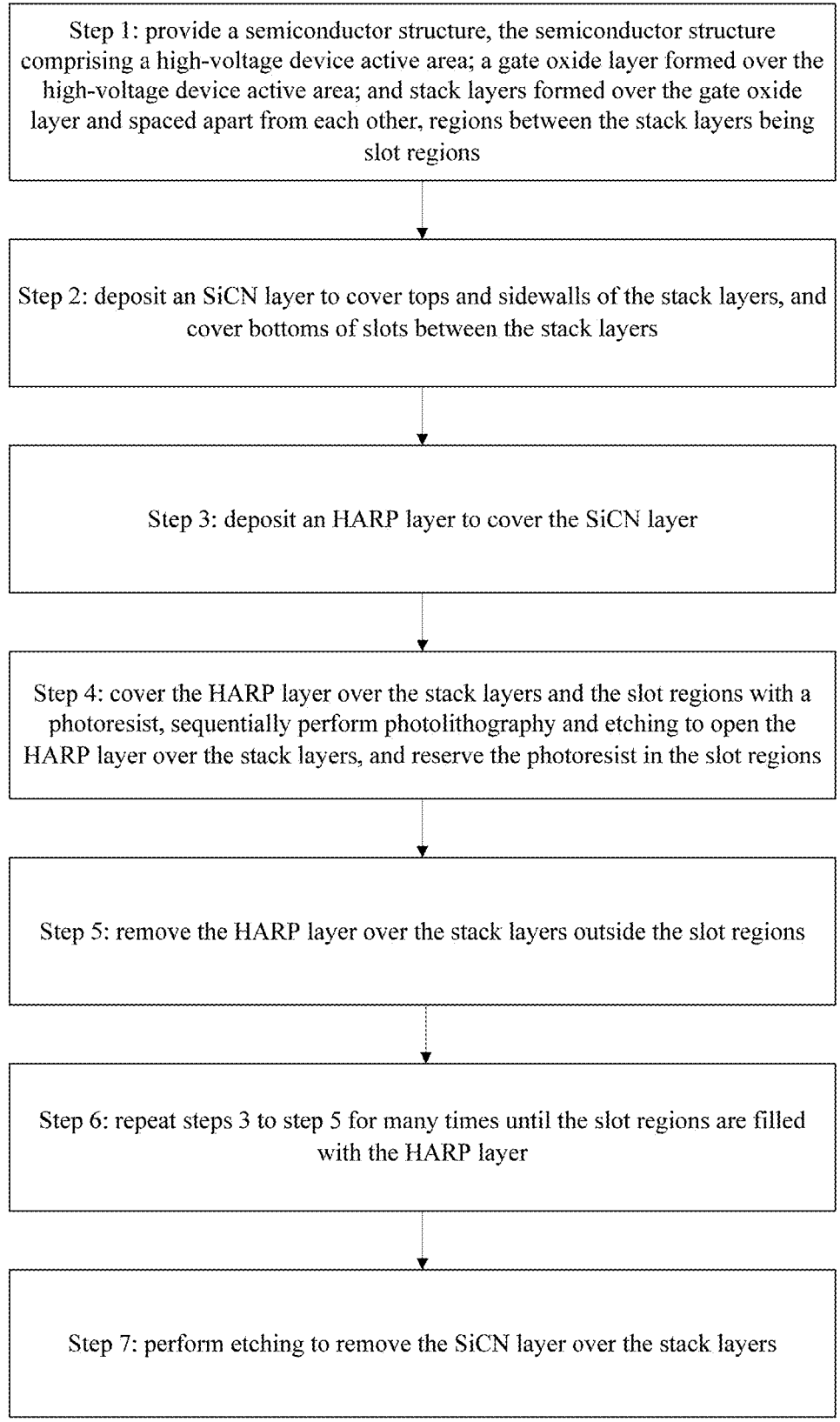
FIG. 7 illustrates a flowchart of a process method for improving reliability of a metal gate high-voltage device according to the present application.

The present application provides a process method for improving reliability of a metal gate high-voltage device. Referring to FIG. 7, it illustrates a flowchart of a process method for improving reliability of a metal gate high-voltage device according to the present application. The method at least includes the following steps:

In step 1, a semiconductor structure is provided. The semiconductor structure includes a high-voltage device active area; a gate oxide layer formed over the high-voltage device active area; and stack layers formed over the gate oxide layer and spaced apart from each other. Regions between the stack layers are slot regions. Referring to FIG. 1, it illustrates a schematic diagram of a semiconductor structure in the present application. In step 1, a semiconductor structure is provided. The semiconductor structure includes a high-voltage device active area (HVAA); a gate oxide layer (GOX) 01 formed over the high-voltage device active area; and stack layers formed over the gate oxide layer and spaced apart from each other. Regions between the stack layers are slot regions B.

Further, in this embodiment, in step 1, the stack layers are formed by sequentially stacking at least polysilicon, silicon nitride and a PEOX layer from bottom to top. Referring to FIG. 1, the stack layers sequentially includes polysilicon (poly), silicon nitride (SiN) and a PEOX layer ("PEOX") 02 from bottom to top.

In step 2, an SiCN layer is deposited to cover tops and sidewalls of the stack layers, and cover bottoms of slots between the stack layers. Referring to FIG. 1, in step 2, an SiCN layer (SiCN) is deposited to cover tops and sidewalls of the stack layers, and cover bottoms of slots B between the stack layers.

Further, in this embodiment, in step 2, the thickness of the SiCN layer (SiCN) is 90 Å.

Further, in this embodiment, in step 2, a method for depositing the SiCN layer (SiCN) is chemical vapor deposition.

Figure 2:
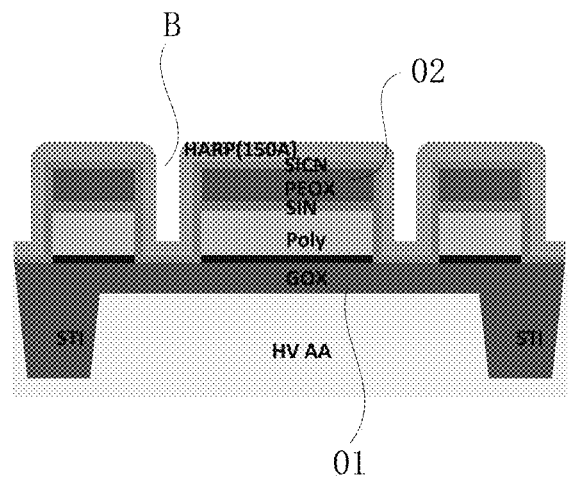
FIG. 2 illustrates a schematic diagram of a structure after an HARP layer is deposited in the present application.

In step 3, an HARP layer is deposited to cover the SiCN layer. Referring to FIG. 2, it illustrates a schematic diagram of a structure after an HARP layer is deposited in the present application. In step 3, an HARP layer is deposited to cover the SiCN layer.

Further, in this embodiment, in step 3, the thickness of the deposited HARP layer is 150 Å.

Figure 3:
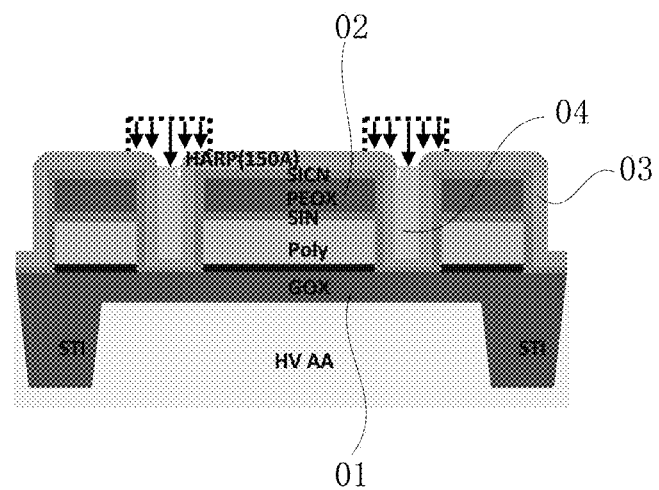
FIG. 3 illustrates a schematic diagram of a structure after a photoresist is filled in slots in the present application.

In step 4, the HARP layer over the stack layers and the slot regions is covered with a photoresist, photolithography and etching are sequentially performed to open the HARP layer over the stack layers, and the photoresist in the slot regions is reserved. Referring to FIG. 3, it illustrates a schematic diagram of a structure after a photoresist is filled in slots in the present application. In step 4, the HARP layer over the stack layers and the slot regions is covered with a photoresist 04, photolithography and etching are sequentially performed to open the HARP layer over the stack layers, and the photoresist 04 in the slot regions is reserved.

Figure 4:
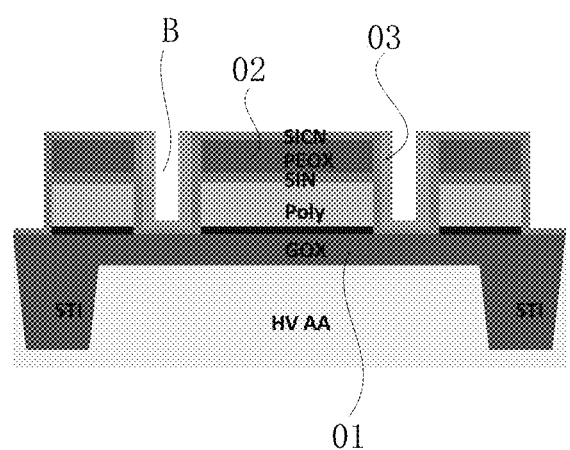
FIG. 4 illustrates a schematic diagram of a structure after an HARP layer over stack layers outside slot regions is removed in the present application.

In step 5, the HARP layer over the stack layers outside the slot regions is removed. Referring to FIG. 4, it illustrates a schematic diagram of a structure after an HARP layer over stack layers outside slot regions is removed in the present application. After the HARP layer over the stack layers outside the slot regions is removed, the photoresist in the slot regions is also removed to form a structure illustrated in FIG. 4. The spacer of the slot regions and the HARP layer at the bottom are exposed.

Further, in this embodiment, in step 5, a wet etching process is adopted to remove the HARP layer over the stack layers outside the slot regions.

Further, in this embodiment, in step 5, etching solution in the wet etching process is hydrofluoric acid.

Further, in this embodiment, in step 5, the concentration of hydrofluoric acid is 300:1 or 200:1.

Figure 5:
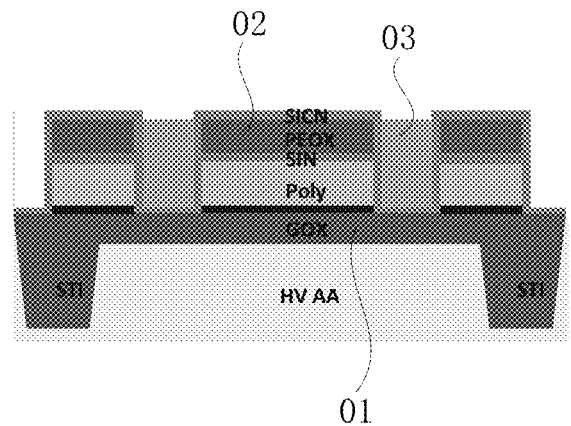
FIG. 5 illustrates a schematic diagram of a structure after slot regions are filled with an HARP layer in the present application.

In step 6, steps 3 to step 5 are repeated for many times until the slot regions are filled with the HARP layer. Referring to FIG. 5, it illustrates a schematic diagram of a structure after slot regions are filled with an HARP layer in the present application. \

Further, in this embodiment, in step 6, step 3 to step 5 are repeated for 1-2 times.

Figure 6:
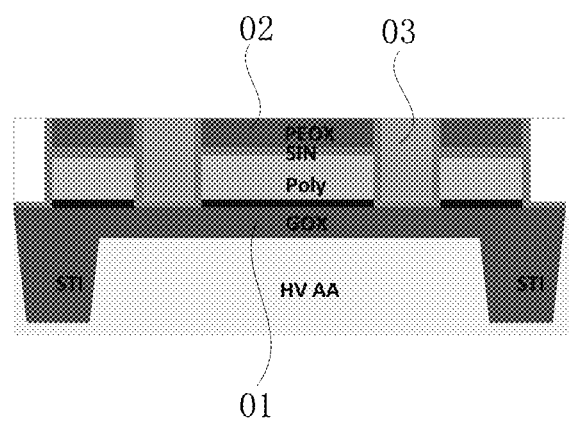
FIG. 6 illustrates a schematic diagram of a structure after etching is performed to remove an SiCN layer over stack layers in the present application.

In step 7, etching is performed to remove the SiCN layer over the stack layers. Referring to FIG. 6, it illustrates a schematic diagram of a structure after etching is performed to remove an SiCN layer over stack layers in the present application.

Further, in this embodiment, in step 7, a method for performing etching to remove the SiCN layer is dry etching.

To sum up, in the present application, by adding the HARP layer in the slot regions and repeating the deposition and etching processes of the HARP layer, an HARP protective layer is formed inside the slot regions and no HARP is remained in other regions, thus improving the reliability of the high-voltage device without affecting other devices. Therefore, the present application effectively overcomes various disadvantages of the existing technology and has a great industrial utilization value.

The above embodiments are only used for exemplarily describing the principle and effect of the present application, instead of limiting the present application. Those skilled in the art may modify or change the above embodiments without departing from the spirit and scope of the present application. Therefore, all equivalent modifications or changes made by those skilled in the art without departing from the spirit and technical concept disclosed by the present application shall still be covered by the claims of the present application.

What is claimed is:

1. A process method for improving reliability of a metal gate high-voltage device, wherein the process method for improving the reliability of the metal gate high-voltage device at least comprises:

step 1: providing a semiconductor structure, the semiconductor structure comprising a high-voltage device active area; a gate oxide layer formed over the high-voltage device active area;
and stack layers formed over the gate oxide layer and spaced apart from each other, regions between the stack layers being slot regions;
step 2: depositing an SiCN layer to cover tops and sidewalls of the stack layers, and cover bottoms of slots between the stack layers;
step 3: depositing a high aspect ratio process (HARP) layer to cover the SiCN layer;
step 4: covering the HARP layer over the stack layers and the slot regions with a photoresist, sequentially performing photolithography and etching to open the HARP layer over the stack layers, and reserving the photoresist in the slot regions;
step 5: removing the HARP layer over the stack layers outside the slot regions;
step 6: repeating steps 3 to step 5 for many times until the slot regions are filled with the HARP layer; and
step 7: performing etching to remove the SiCN layer over the stack layers.

2. The process method for improving the reliability of the metal gate high-voltage device according to claim 1, wherein in step 1, the stack layers are formed by sequentially stacking at least polysilicon, silicon nitride, and a plasma enhanced oxide (PEOX) layer from bottom to top.

3. The process method for improving the reliability of the metal gate high-voltage device according to claim 1, wherein in step 2, a thickness of the SiCN layer is 90 Å.

4. The process method for improving the reliability of the metal gate high-voltage device according to claim 1, wherein in step 2, a method for depositing the SiCN layer is chemical vapor deposition.

5. The process method for improving the reliability of the metal gate high-voltage device according to claim 1, wherein in step 3, a thickness of the deposited HARP layer is 150 Å.

6. The process method for improving the reliability of the metal gate high-voltage device according to claim 1, wherein in step 5, a wet etching process is adopted to remove the HARP layer over the stack layers outside the slot regions.

7. The process method for improving the reliability of the metal gate high-voltage device according to claim 6, wherein in step 5, etching solution in the wet etching process is hydrofluoric acid.

8. The process method for improving the reliability of the metal gate high-voltage device according to claim 1, wherein in step 5, a concentration of hydrofluoric acid is 300:1 or 200:1.

9. The process method for improving the reliability of the metal gate high-voltage device according to claim 1, wherein in step 6, step 3 to step 5 are repeated for 1-2 times.

10. The process method for improving the reliability of the metal gate high-voltage device according to claim 1, wherein in step 7, a method for performing etching to remove the SiCN layer is dry etching.

* * * * *